(12) United States Patent
Chen et al.

(10) Patent No.: US 10,833,596 B1
(45) Date of Patent: Nov. 10, 2020

(54) INTEGRATED POWER UNIT FOR A POWER SUPPLY DEVICE

(71) Applicant: FORD GLOBAL TECHNOLOGIES, LLC, Dearborn, MI (US)

(72) Inventors: Lihua Chen, Farmington Hills, MI (US); Fan Wang, Novi, MI (US); Fan Xu, Novi, MI (US); Baoming Ge, Okemos, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/435,752

(22) Filed: Jun. 10, 2019

(51) Int. Cl.
| | |
|---|---|
| *H02M 7/00* | (2006.01) |
| *H05K 7/20* | (2006.01) |
| *H02K 11/00* | (2016.01) |
| *H02K 11/33* | (2016.01) |
| *H02M 7/5387* | (2007.01) |
| *H02G 5/02* | (2006.01) |
| *B60L 50/51* | (2019.01) |
| *H02M 1/14* | (2006.01) |

(52) U.S. Cl.
CPC .......... *H02M 7/003* (2013.01); *B60L 50/51* (2019.02); *H02G 5/02* (2013.01); *H02K 11/0094* (2013.01); *H02K 11/33* (2016.01); *H02M 7/5387* (2013.01); *H05K 7/20872* (2013.01); *H05K 7/20927* (2013.01); *B60L 2210/40* (2013.01); *H02M 1/14* (2013.01)

(58) Field of Classification Search
CPC ........ H02M 7/003; H02M 7/48; H02M 7/537; H02M 2007/4835; H02M 7/5387; H02M 1/32; H02M 1/14; H05K 7/1432; H05K 7/20927; H05K 7/209; H05K 7/20872; H02K 11/33; H02K 9/19; H02K 11/0094; B60L 2210/40; B60L 50/51; H02G 5/10; H02G 5/02
See application file for complete search history.

(56) References Cited

U.S. PATENT DOCUMENTS

| | | | |
|---|---|---|---|
| 9,445,532 B2 | 9/2016 | Chen et al. | |
| 9,583,264 B2 | 2/2017 | Kamizuma et al. | |
| 9,954,409 B2 | 4/2018 | Lei et al. | |
| 2008/0186751 A1* | 8/2008 | Tokuyama | H05K 7/20927 363/131 |
| 2009/0015185 A1* | 1/2009 | Yoshida | B60K 6/405 318/504 |
| 2009/0023305 A1* | 1/2009 | Korich | H01M 2/206 439/34 |
| 2009/0161301 A1* | 6/2009 | Woody | H05K 7/209 361/678 |
| 2011/0221268 A1* | 9/2011 | Kanazawa | H05K 1/0263 307/10.1 |
| 2017/0033638 A1* | 2/2017 | Lei | H02K 5/08 |

\* cited by examiner

*Primary Examiner* — Adam B Dravininkas
(74) *Attorney, Agent, or Firm* — David B. Kelley; Brooks Kushman P.C.

(57) ABSTRACT

A DC to AC inverter includes a plurality of power units. Each power unit has a pair of switches, a DC linking capacitor, AC and DC bus bars, and a monolithic insulating material that encapsulates the switches, capacitor and bus bars. Each switch is sandwiched between one of the AC bars and one of the DC bus bars. The monolithic insulating material exposes external surfaces of at least one the bus bars sandwiching each switch.

20 Claims, 4 Drawing Sheets

US 10,833,596 B1

INTEGRATED POWER UNIT FOR A POWER SUPPLY DEVICE

TECHNICAL FIELD

The present disclosure relates to electric vehicles and power supply devices for electric vehicles.

BACKGROUND

Electric and hybrid vehicles may include power modules that are configured to convert electrical power from direct electrical current (DC) into alternating electrical current (AC) and/or vice versa.

SUMMARY

A vehicle includes an electric machine, a battery, and an inverter. The electric machine is configured to propel the vehicle. The battery is configured to provided electrical power to the electric machine. The inverter is configured to convert DC electrical power from the battery into AC electrical power and to deliver the AC electrical power to the electric machine. The inverter comprises an array of power units. Each power unit has a pair of switching circuits, a DC linking capacitor, AC and DC bus bars, and a monolithic insulating material that encapsulates the switching circuits, capacitor, and bus bars. Each switching circuit is sandwiched between one of the AC bus bars and one of the DC bus bars. Each switching circuit is electrically connected to the DC linking capacitor via the DC bus bars. The monolithic insulating material exposes external surfaces of at least one the bus bars sandwiching each switching circuit.

A DC to AC inverter includes a plurality of power units. Each power unit has a pair of switches, a DC linking capacitor, AC and DC bus bars, and a monolithic insulating material that encapsulates the switches, capacitor and bus bars. Each switch is sandwiched between one of the AC bars and one of the DC bus bars. The monolithic insulating material exposes external surfaces of at least one the bus bars sandwiching each switch.

A power unit for a DC to AC inverter includes bus bars, a pair of switches, a DC linking capacitor, and a monolithic insulating material. The pair of switches are electrically connected to the DC linking capacitor via the bus bars. Each switch is sandwiched between a pair of the bus bars. The monolithic insulating material encapsulates the switches, capacitor, and bus bars. The monolithic insulating material exposes external surfaces of at least one the bus bars sandwiching each switch.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
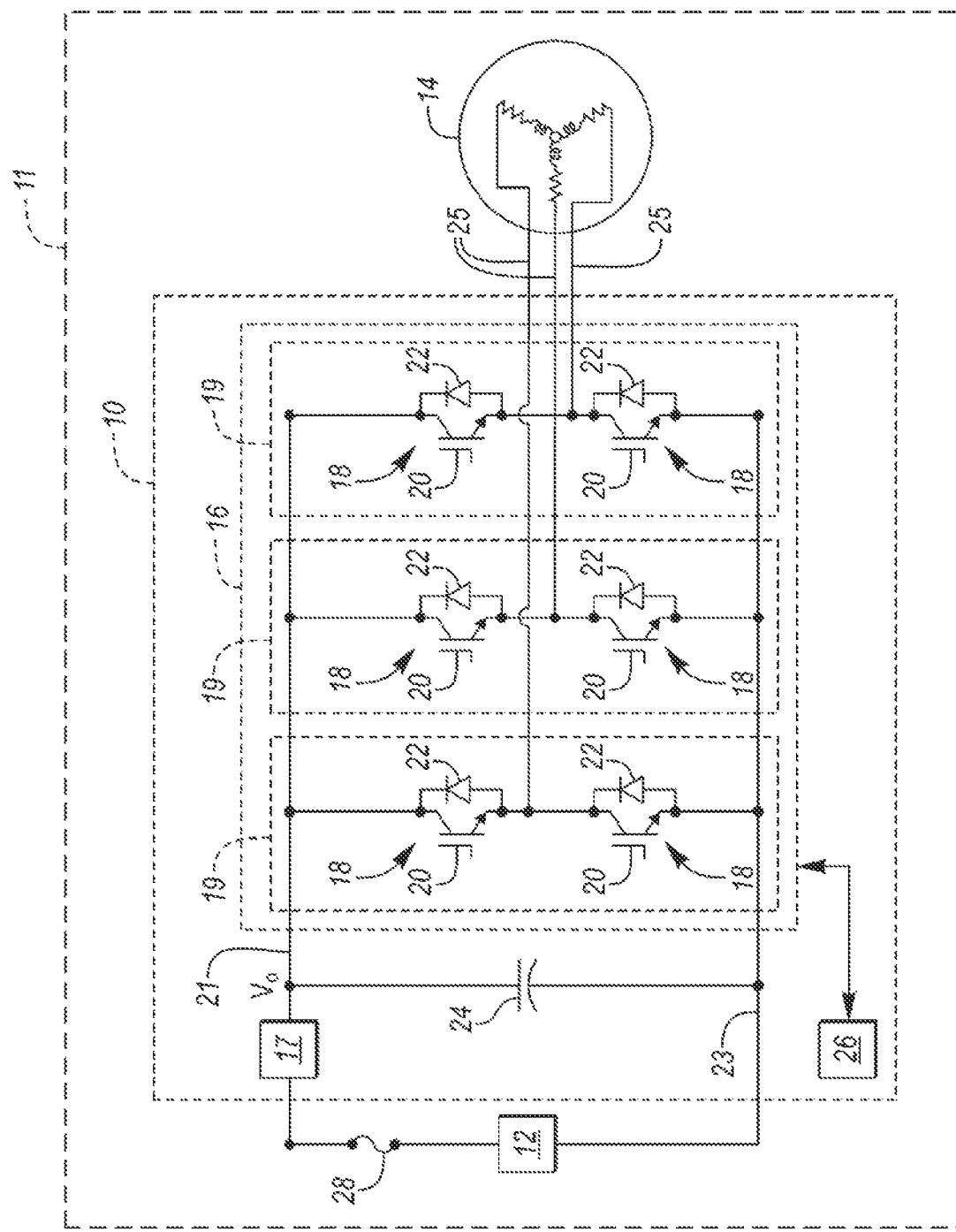
FIG. 1 is a circuit diagram of an inverter that is coupled to a DC power source and an electric machine.

Referring to FIG. 1, a circuit diagram of an inverter 10 coupled to a power source 12 and an electric machine 14 is illustrated. The inverter 10 may also be referred to as a power controller or a power supply device. The electric machine may be an electric motor or a motor/generator combination. The inverter 10 may be utilized in an electric drive system of a vehicle 11, such as an electric or hybrid vehicle. The power source 12 may be coupled to the inverter 10 in order to drive the electric machine 14. In some contexts, including the context of an electric or hybrid vehicle, the power source 12 may be a battery, such as a traction battery that is configured to provided electrical power to the electric machine 14, and the electric machine 14 may be an electric motor or an electric motor/generator combination, that is configured to propel the vehicle 11. The inverter 10 may include inverting circuitry 16 and a voltage converter 17. The voltage converter 17 may be DC to DC converter. Alternatively, the voltage converter 17 may be a separate component that is not integral to the inverter 10. The inverting circuitry 16 and the voltage converter 17 may be configured to deliver electrical power to the electric machine 14.

The inverting circuitry 16 may include switching units 18. The switching units 18 may be referred to switching circuits or switches. The switching units 18 may each comprise a transistor 20, such as an insulated gate bipolar transistor (IGBT), in antiparallel with a diode 22. Alternatively, other types of circuits may be utilized, such as metal-oxide semiconductor field-effect transistors (MOSFETs), to form the switching units 18. Pairs 19 of the switching units 18 are arranged in series and extend between the positive DC bus 21 and negative DC bus 23 of the power source 12. The pairs 19 of switching units 18 each comprise a half-bridge 19 of the inverting circuitry 16. Each half-bridge 19 is connected to one phase of the electric machine 14 via an AC bus 25. The switching units 18 may be configured to provide AC power to the electric machine 14. More specifically, the inverting circuitry 16 may be configured to convert DC power provided by the power source 12 into AC power, which is then delivered to the electric machine 14. The inverter 10 may include a DC-linking capacitor 24. The linking capacitor 24 may be disposed between the power source 12 and the inverting circuitry 16. The linking capacitor 24 also extends between the positive DC bus 21 and negative DC bus 23 of the power source 12. The linking capacitor 24 may be configured to absorb ripple currents generated at the inverting circuitry 16 or the power source 12, and stabilize the DC-link voltage, Vo, for inverting circuitry 16 control. Stated in other terms, the linking capacitor 24 may be arranged to limit voltage variation at an input of inverting circuitry 16 due to ripple currents generated by the inverting circuitry 16 or a battery, such as a traction battery, that may comprise the power source 12. The inverter 10 may include a drive board 26 for controlling the inverting circuitry 16. The drive board 26 may be a gate drive board that is configured to operate the transistors 20 of the switching units 18 when converting the DC power from the power source 12 into AC power and delivering the AC power to the electric machine 14.

The voltage converter 17 may include an inductor. The circuitry of the voltage converter (not shown), including the inductor, may be configured to amplify or increase the voltage of the electrical power being delivered to the electric machine 14 from the power source 12. A fuse 28 may be disposed on the direct current side of the inverting circuitry 16 to protect the inverting circuitry 16 from surges in electrical power.

The disclosure should not be construed as limited to the circuit diagram of FIG. 1, but should include power control devices that include other types inverting circuitry, capacitors, converters, or combinations thereof. For example, the inverting circuitry 16 may be an inverter that includes any number of switching units and is not limited to the number of switching units depicted in FIG. 1. Alternatively, the linking capacitor 24 may be configured to couple one or a plurality of inverters to a power source.

Figure 2:
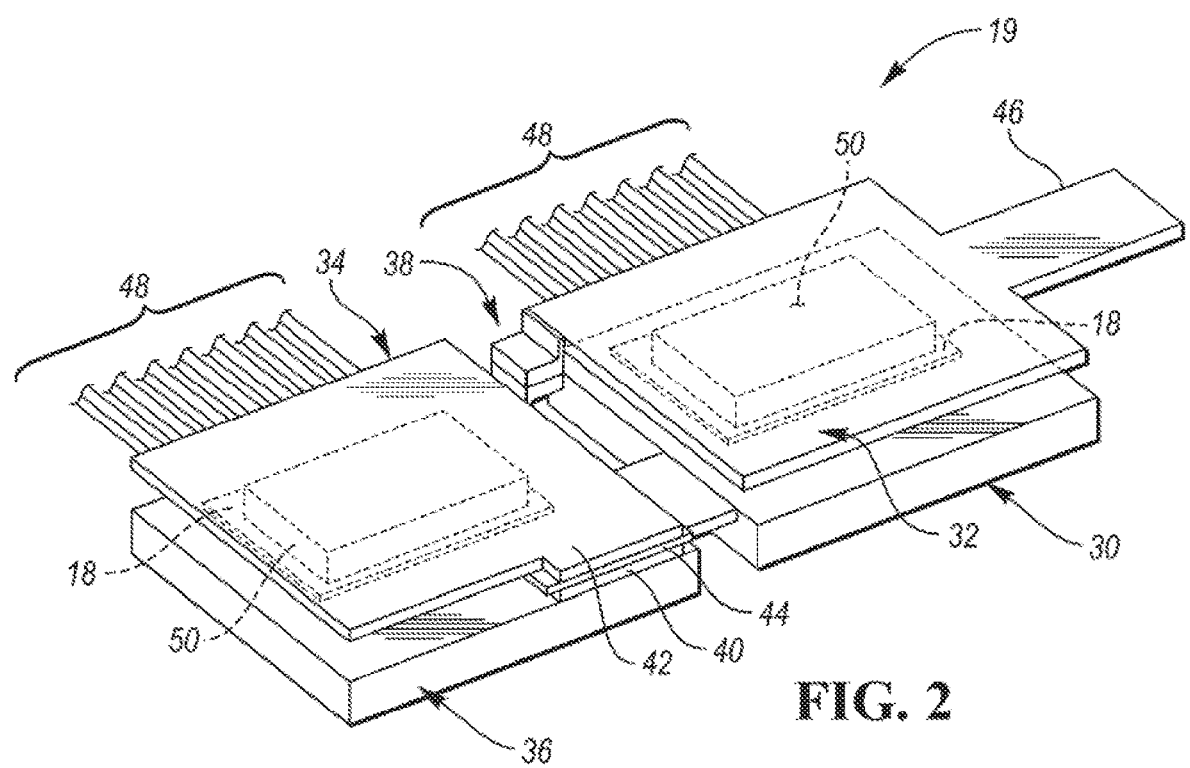
FIG. 2 illustrates one of the half-bridges that forms the inverting circuitry.

Referring to FIG. 2, one of the half-bridges 19 that forms the inverting circuitry 16 is illustrated. Each of the switching units 18 is sandwiched between a pair of metal plates. More specifically, each of the metal plates may comprise bus bars that form a portion of the positive DC bus 21, negative DC bus 23, or AC bus 25. For example, a first of the switching units 18 that form the half bridge 19 may be sandwiched between and electrically connected to both a first of the metal plates 30, which is a portion of the positive DC bus 21, and a second of the metal plates 32, which is a portion of AC bus 25. A second of the switching units 18 that form the half bridge 19 may be sandwiched between and electrically connected to both a third of the metal plates 34, which is a portion of the negative DC bus 23, and a fourth of the metal plates 36, which is also a portion of AC bus 25.

The switching units 18 within the half-bridge 19 are electrically connected to each other in series via AC bus 25. More specifically, the second of the metal plates 32 and the fourth of the metal plates 36 (which are both portions of the AC bus 25) are electrically connected to each other at terminal 38. The first of the metal plates 30 (which is a portion of the positive DC bus 21) may include terminal 40 and the third of the metal plates 34 (which is a portion of the negative DC bus 23) may include terminal 42. Terminal 40 and terminal 42 are utilized to connect the half-bridge 19 to a portion of the linking capacitor 24. Terminal 40 may overlap terminal 42 to reduce the parasitic inductance. An insulating sheet 44 may be placed in between terminal 40 and terminal 42 for electrical insulating purposes. The second of the metal plates 32 (which is a portion of AC bus 25) may include terminal 46 for AC output. Terminal 46 may be utilized to establish an electrical connection between the half-bridge 19 and one-phase of the electrical machine 14. Alternatively, terminal 46 may extend from the fourth of the metal plate 36 instead of the second metal plate 32. It should be understood that the positions of terminals 40, 42, and 46 may be adjusted (e.g., the terminals may protrude from another end of their respective metal plates in a direction other than show in FIG. 2) based on design or packaging requirements.

Digital electrical terminals 48, which are configured to establish electrical connections between the switching units 18 within the half-bridge 19 and the drive board 26. The digital electrical terminals may be connected to the power semiconductors (i.e., the switching units 18) through wire bonding.

A heat spreader 50 may be disposed between each switching unit 18 and one of the respective plates that each switching unit 18 is sandwiched between. More specifically, a first of the heat spreaders 50 may be disposed between a first of the switching units 18 and the second of the metal plates 32 (which is a portion of AC bus 25) and a second of the heat spreaders 50 may be disposed between a second of the switching units 18 and the third of the metal plates 34 (which is a portion of the negative DC bus 23). Additionally, or in the alternative, the heat spreaders 50 may be disposed between each of the switching units 18 and the other of the respective plates that each switching unit 18 is sandwiched between. The heat spreaders 50 may be plates or blocks of material that have both good electrical and thermal conductivity, such as copper, aluminum, steel, etc.

Figure 3:
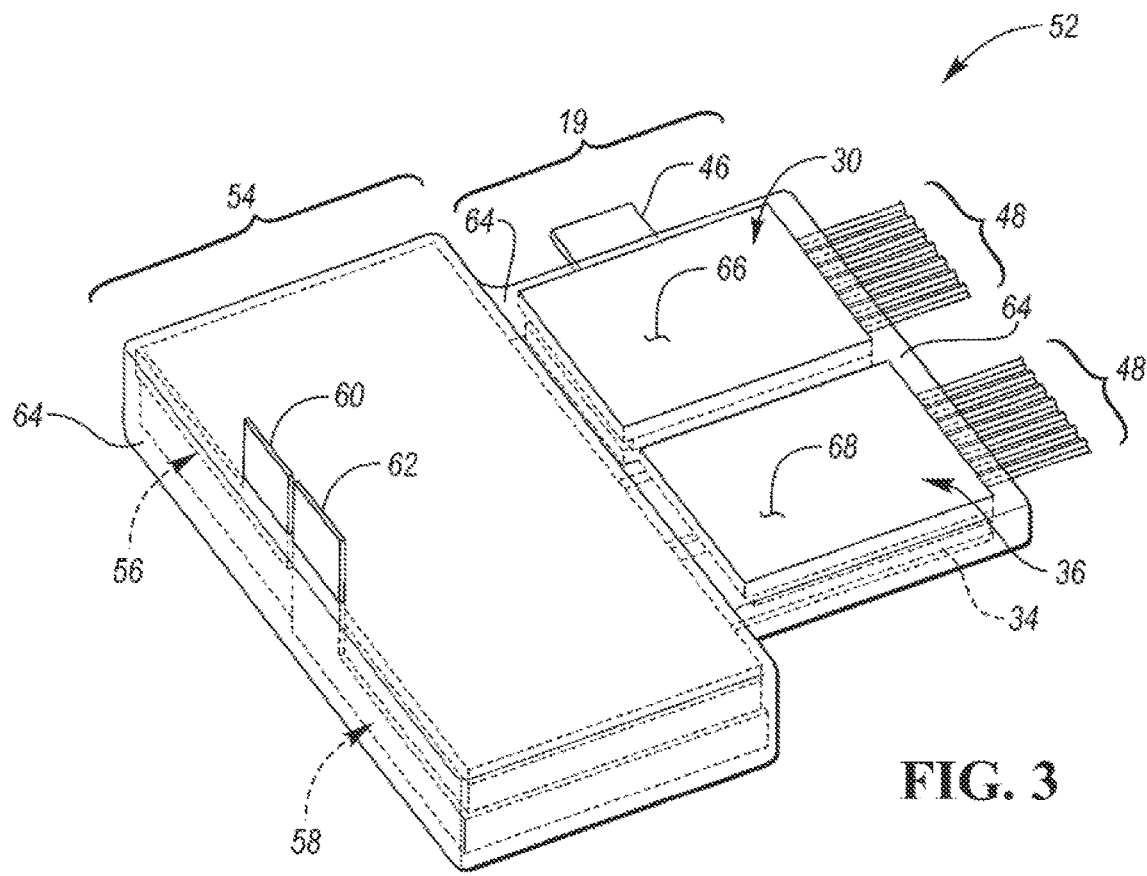
FIG. 3 illustrates one of an array of power units that are utilized to construct the inverter.

Referring to FIG. 3, one of any array of power units 52 that are utilized to construct the inverter 10 is illustrated. At least three power units 52 are interconnected to form an inverter 10 that outputs three-phases of AC power as illustrated by the inverter 10 in FIG. 1. Each power unit 52 includes a half-bridge 19 and a capacitor 54. When the array of power units 52 are connected to form the inverter 10, the capacitors 54 of the power units collectively form the linking capacitor 24. The capacitor 54 may be a stacked film capacitor. The capacitor 54 includes a fifth metal plate 56, which is a portion of the positive DC bus 21, and a sixth metal plate 58, which is a portion of the negative DC bus 23. The fifth metal plate 56 and the sixth metal plate 58 electrically connect the capacitor 54 to the half-bridge 19. More specifically, the fifth metal plate 56 may be connected to the first of the metal plates 30, which is also portion of the positive DC bus 21, via terminal 40, and the sixth metal plate 58 may be connected to the third of the metal plates 34, which is a portion of the negative DC bus 23, via terminal 42 in order to electrically connect the capacitor 54 to the half-bridge 19. The fifth metal plate 56 may include terminal 60 and the sixth metal plate 58 may include terminal 62. Terminals 60 and 62 may be utilized to establish an electrical connection between the power unit 52, or more specifically the capacitor 54, and the power source 12.

The power unit 32 may be encapsulated by a monolithic non-metal insulating material 64. More specifically, the half-bridge 19 (including a pair of the switching units 18), capacitor 54, portions of the positive DC bus 21 (including the first of the metal plates 30 and the fifth metal plate 56), portions of the negative DC bus 23 (including the third of the metal plates 34 and the sixth metal plate 58), and portions of the AC bus 25 (including the second of the metal plates 32 and the fourth of the metal plates 36) may be encapsulated by the monolithic non-metal insulating material 64. Monolithic may refer to an item that is cast as a single unit, that is formed or composed of a material without joints or seams, or that consists of a single unit. The monolithic non-metal insulating material 64 may comprise an electrically non-conductive epoxy, resin, plastic, or other material that is capable of over molding and encapsulating the half-bridge 19, capacitor 54, and metal plates (i.e., bus bars) into a single package or component, such that voltage isolation is provided between half-bridge 19 and capacitor 54. The monolithic non-metal insulating material 64 may be monolithic in that it is a solid single piece. The monolithic non-metal insulating material 64 may form a solid single piece that both surrounds the half-bridge 19, capacitor 54, and metal plates (i.e., bus bars), and fills any voids that may exist between the half-bridge 19, capacitor 54, and metal plates (i.e., bus bars). The monolithic non-metal insulating material 64 may also provide thermal insulation between the half-bridge 19 and capacitor 54.

The monolithic insulating material 64 may expose external surfaces of at least one of the plates that sandwich each switching unit 18. More specifically, the monolithic insulating material 64 may expose an external surface 66 of the first of the metal plates 30 and an external surface 68 of the fourth of the metal plates 36. Additionally, or in the alternative, the monolithic non-metal insulating material 64 may expose an external surface of the second of the metal plates 32 and an external surface of the third of the metal plates 34. The heat spreaders 50 are more specifically in direct contact with the metal plates and are disposed between one of the switching units 18 and one of the exposed external surfaces of the metal plates (e.g., external surfaces 66 and 68) in order to facilitate heat transfer from the switching units to the exterior of the power unit 52 via the exposed external surfaces 66 and 68. External surface 66 and external surface 68 may be substantially aligned along the same plane. Substantially align along the same plane may include deviations of up to 5 millimeters or of up to 5° from being on exactly the same plane.

Terminal 46 may protrude through the monolithic insulating material 64 in order to receive connection to the electric machine 14. The digital terminals 48 may protrude through the monolithic insulating material 64 in order to receive connection to the drive board 26. Terminals 60 and 62 may protrude through the monolithic insulating material 64 in order to receive connection to the power source 12. A parallel connection between terminals 60 and 62 of the array of power units 52 forms the inverting circuitry and linking capacitor connection for the inverter 10.

Figure 4:
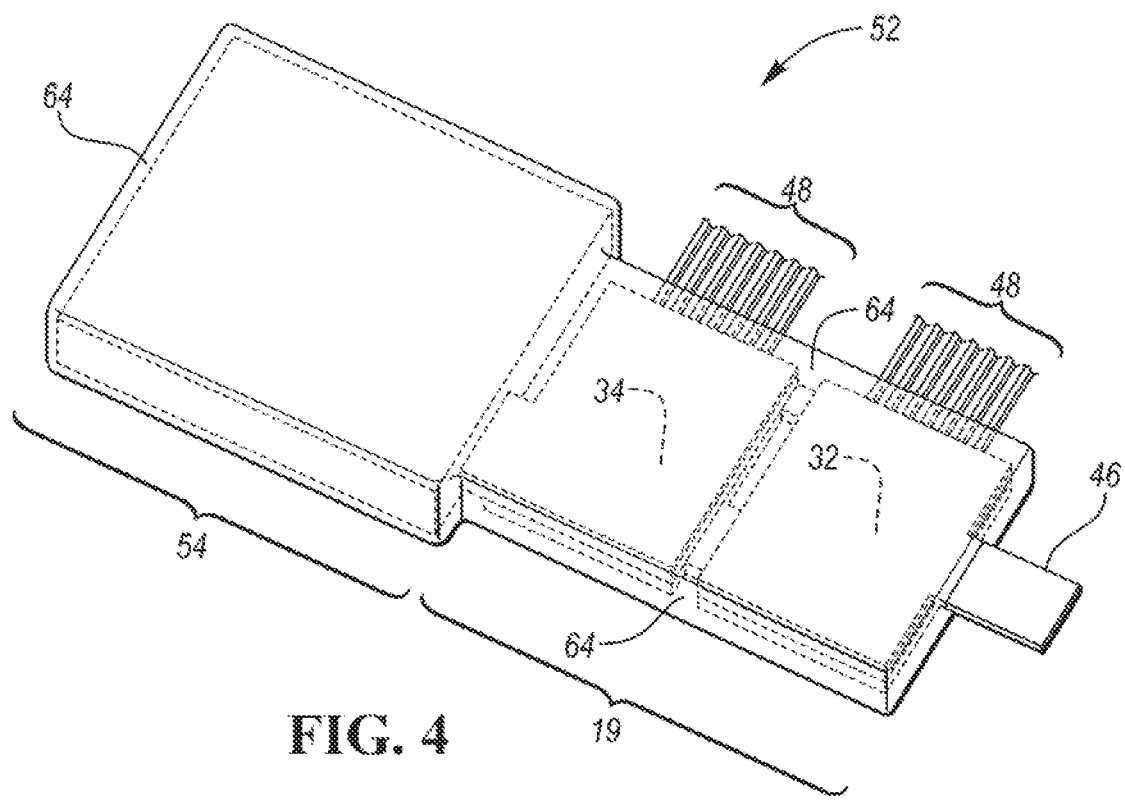
FIG. 4 illustrates a first alternative arrangement for the power units.
Figure 5:
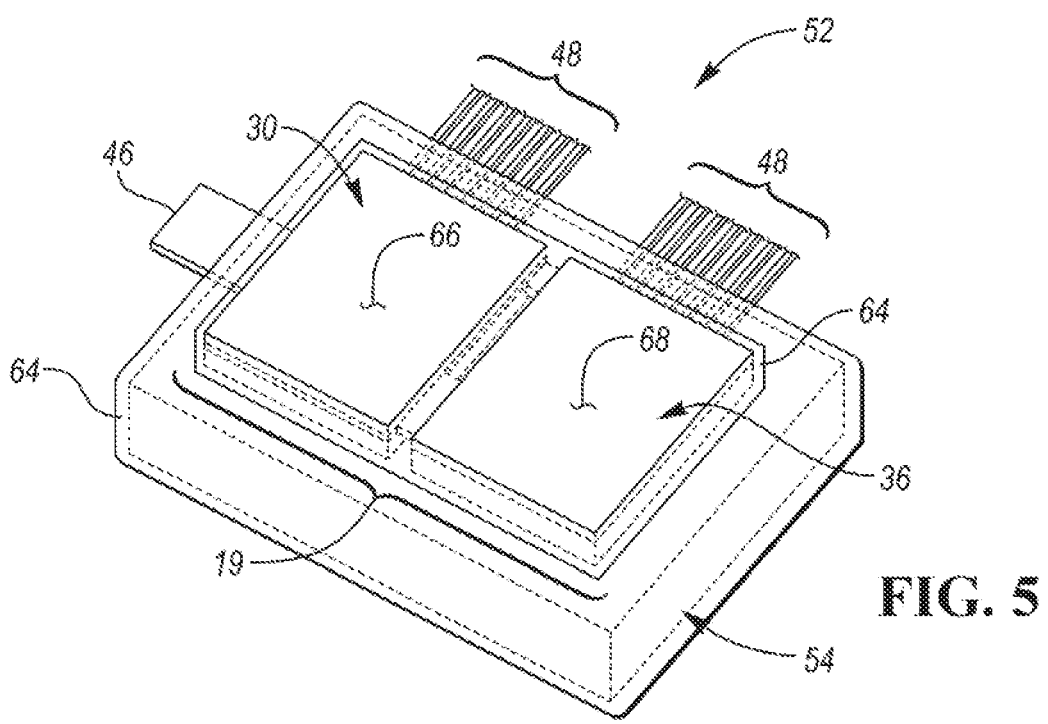
FIG. 5 illustrates a second alternative arrangement for the power units.

The half-bridge 19 of the power unit 52 in FIG. 3 is disposed adjacent to a long edge of the capacitor 54. The half-bridge 19 and the capacitor 54 are both laid flat, which increases the overall surface area of the power unit along top and bottom sides of the power unit 52. FIGS. 4 and 5 depict first and second alternative arrangements for the power units 52, respectively. The first alternative arrangement depicts the half-bridge 19 being disposed adjacent to a short edge of the capacitor 54, where the both the half-bridge 19 and the capacitor 54 are laid flat. The second alternative arrangement depicts the half-bridge 19 being disposed on top of the capacitor 54. These different arrangements may be geared to the desire of specific applications. For example, the arrangements depicted FIGS. 3 and 4 may facilitate increased cooling of the power unit 52 by increasing the overall external surface area of the power unit 52, while the arrangement depicted in FIG. 5 may facilitate packing requirements for more compact designs.

Figure 6:
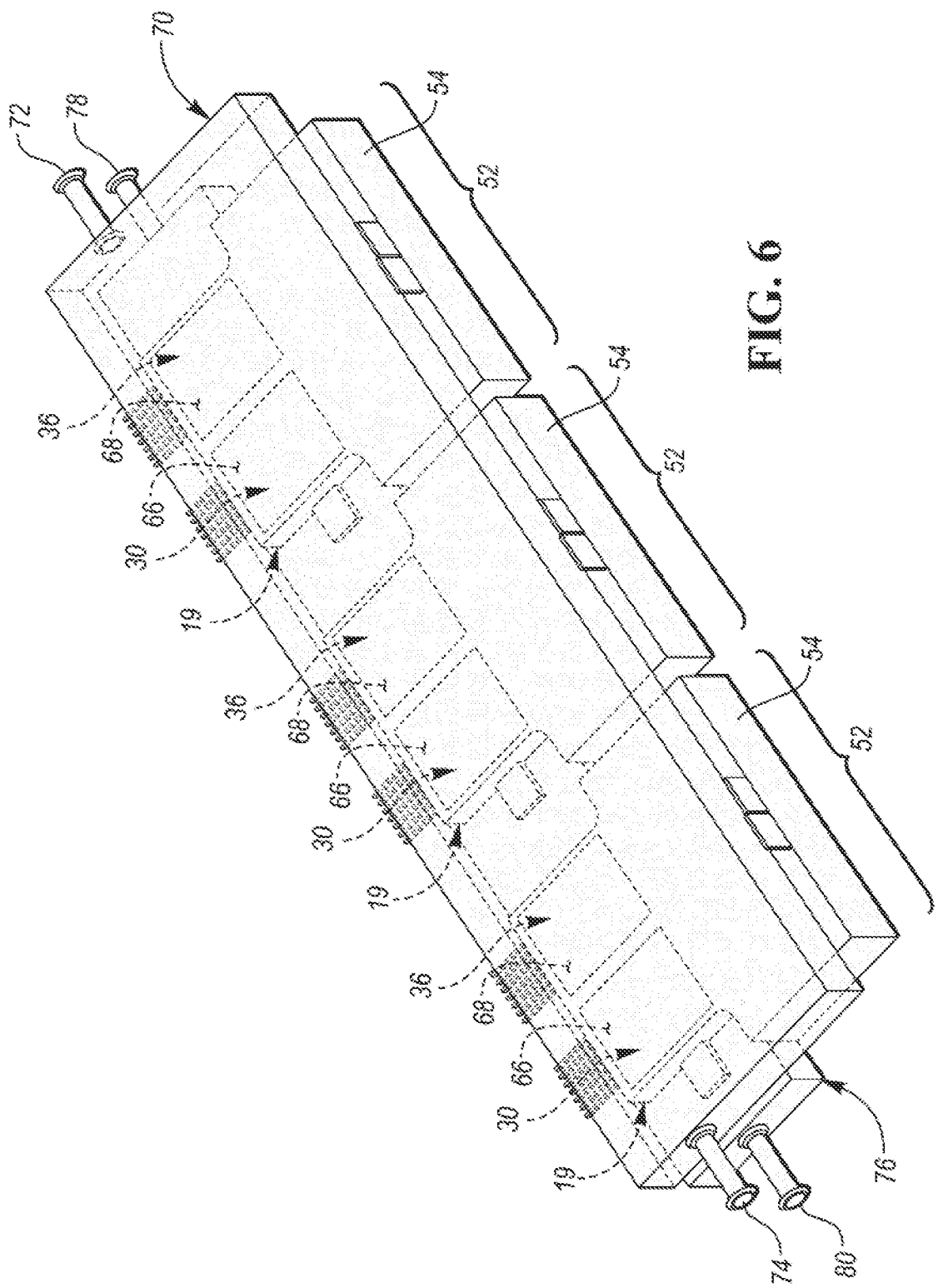
FIG. 6 illustrates the array of power units and a cooling system for the array of power units.

Referring to FIG. 6, an array of power units 52 and a cooling system for the army of power units 52 is illustrated. More specifically, the inverter 10 may be a three-phase inverter and array the array of power units 52 may include exactly three power units 52 that convert DC power into three-phase AC power. The exposed external surfaces (e.g., external surfaces 66 and 68) of the plates (e.g., the first of the metal plates 30 and the fourth of the metal plates 36) that sandwich each switching unit 18 of each power unit 52 in the array of power units may be substantially aligned along the same plane. Substantially align along the same plane may include deviations of up to 5 millimeters or of up to 5° from being on exactly the same plane.

The cooling system may include a first cooling manifold 70 that is disposed on each of the exposed external surfaces (e.g., external surfaces 66 and 68) of the plates (e.g., the first of the metal plates 30 and the fourth of the metal plates 36) of each power unit 52. The first cooling manifold 70 may extend beyond and edge of the plates (e.g., the first of the metal plates 30 and the fourth of the metal plates 36) and overlap the capacitors 54 of each power unit 52. The first cooling manifold 70 may include an inlet 72 and an outlet 74 that allow a cooling liquid to flow through the cooling manifold 70 and remove excess heat from the power units 52. Heat transfer may be facilitated from the switching units 18 and into the liquid flowing through the cooling manifold 70 via the heat spreaders 50 and via direct contact between the external surfaces (e.g., external surfaces 66 and 68) of the plates that remain exposed through the monolithic non-metal insulating material 64 and the cooling manifold 70.

The cooling system may include a second cooling manifold 76. Each switching unit 18, and the plates (e.g., plates 30, 32, 34, and 36) that each switching unit 18 is sandwiched between, are further sandwiched between the first cooling manifold 70 and the second cooling manifold 76. The second cooling manifold 76 may include an inlet 78 and an outlet 80 that allow a cooling liquid to flow through the cooling manifold 70 and remove excess heat from the power units 52.

The words used in the specification are words of description rather than limitation, and it is understood that various changes may be made without departing from the spirit and scope of the disclosure. As previously described, the features of various embodiments may be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. As such, embodiments described as less desirable than other embodiments or prior art implementations with respect to one or more characteristics are not outside the scope of the disclosure and may be desirable for particular applications.

What is claimed is:

1. A vehicle comprising:
   an electric machine configured to propel the vehicle;
   a battery configured to provide electrical power to the electric machine; and
   an inverter configured to convert DC electrical power from the battery into AC electrical power and to deliver the AC electrical power to the electric machine, the inverter comprising an array of power units,
   each power unit having,
     a pair of switching circuits,
     a DC linking capacitor,
     AC and DC buses, each of the AC and DC buses comprising a series of interconnected plates and terminals, and
     a monolithic insulating material that encapsulates the switching circuits, capacitor, and buses, wherein each switching circuit is sandwiched between one of the plates that comprises a portion of the AC bus and one of the plates that comprises a portion of the DC bus such that one of the plates completely overlays an upper surface area of each switching circuit and one of the plates completely overlays a lower surface area of each switching circuit, wherein each switching circuit is electrically connected to the DC linking capacitor via the DC bus, and wherein the monolithic insulating material exposes external surfaces of at least one the plate sandwiching each switching circuit, wherein each of the exposed external surfaces faces away from and is disposed on an opposing side of the respective plate relative to one of the switching circuits.

2. The vehicle of claim 1, wherein the exposed external surfaces of the plates within each power unit are substantially aligned along the same plane.

3. The vehicle of claim 1, wherein the exposed external surfaces of the plates of each power unit of the array of power units are substantially aligned along the same plane.

4. The vehicle of claim 3 further comprising a cooling manifold disposed on each of the external surfaces of the exposed plates of each power unit.

5. The vehicle of claim 1 further comprising first and second cooling manifolds, and wherein each switching circuit, and the respective plates that each switching circuit is sandwiched between, are sandwiched between the first and second cooling manifolds.

6. The vehicle of claim 5, wherein at least one of the first and second cooling manifolds extends beyond and edge of the plates and overlaps the DC linking capacitors.

7. The vehicle of claim 1, wherein the inverter is a three-phase inverter, the array of power units includes three power units, and the pairs of switching circuits of each power unit are a half-bridge of the three-phase inverter.

8. The vehicle of claim 1 further comprising a heat spreader disposed between each switching circuit and the exposed external surface of the respective plate that each switching circuit is sandwiched between.

9. A DC to AC inverter comprising:
a plurality of power units each having a pair of switches, a DC linking capacitor, AC and DC buses, each of the AC and DC buses comprising a series of interconnected plates and terminals, and a monolithic insulating material that encapsulates the switches, capacitor, and buses, wherein each switch is sandwiched between one of the plates that comprises a portion of the AC bus and one of the plates that comprises a portion of the DC bus, such that one of the plates completely overlays an upper surface area of each switch and one of the plates completely overlays a lower surface area of each switch, and wherein the monolithic insulating material exposes external surfaces of at least one the plates sandwiching each switch, wherein each of the exposed external surfaces faces away from and is disposed on an opposing side of the respective plate relative to one of the switches.

10. The inverter of claim 9, wherein the exposed external surfaces of the plates are substantially aligned along the same plane.

11. The inverter of claim 9, wherein the expose external surfaces of the plates of each power unit of the plurality of power units are substantially aligned along the same plane.

12. The inverter of claim 11 further comprising a cooling manifold disposed on each of the exposed external surfaces of the plates of each power unit.

13. The inverter of claim 9 further comprising first and second cooling manifolds, and wherein each switch, and the respective plates that each switch is sandwiched between, are sandwiched between the first and second cooling manifolds.

14. The inverter of claim 13, wherein at least one of the first and second cooling manifolds extends beyond and edge of the plates and overlaps the DC linking capacitors.

15. The inverter of claim 9, wherein the inverter is a three-phase inverter, the plurality of power units includes three power units, and the pairs of switches of each power unit are a half-bridge of the three-phase inverter.

16. The inverter of claim 9 further comprising a heat spreader disposed between each switch and the exposed external surface of the respective plate that each switch is sandwiched between.

17. A power unit for a DC to AC inverter comprising:
AC and DC buses, each of the AC and DC buses comprising a series of interconnected plates and terminals;
a pair of switches electrically connected to a DC linking capacitor via the DC bus, each switch being sandwiched between one of the plates that comprises a portion of the AC bus and one of the plates that comprises a portion of the DC bus, such that one of the plates completely overlays an upper surface area of each switch and one of the plates completely overlays a lower surface area of each switch, and
a monolithic insulating material encapsulating the switches, capacitor, and buses, wherein the monolithic insulating material exposing external surfaces of at least one the plates sandwiching each switch, wherein each of the exposed external surfaces faces away from and is disposed on an opposing side of the respective plate relative to one of the switches.

18. The power unit of claim 17, wherein the exposed external surfaces of the plates are substantially aligned along the same plane.

19. The power unit of claim 17, wherein the pair of switches are a half-bridge of an inverting circuit.

20. The power unit of claim 17 further comprising a heat spreader disposed between each switch and the exposed external surface of the respective plate that each switch is sandwiched between.

* * * * *